US011802332B2

(12) United States Patent
Hirano et al.

(10) Patent No.: US 11,802,332 B2
(45) Date of Patent: Oct. 31, 2023

(54) METHOD FOR MANUFACTURING NEAR-INFRARED SENSOR COVER

(71) Applicant: TOYODA GOSEI CO., LTD., Kiyosu (JP)

(72) Inventors: Risa Hirano, Kiyosu (JP); Koji Okumura, Kiyosu (JP); Koji Fukagawa, Kiyosu (JP); Katsuyuki Hirano, Kiyosu (JP)

(73) Assignee: TOYODA GOSEI CO., LTD., Aichi-pref. (JP)

( * ) Notice: Subject to any disclaimer, the term of this patent is extended or adjusted under 35 U.S.C. 154(b) by 0 days.

(21) Appl. No.: 17/674,033

(22) Filed: Feb. 17, 2022

(65) Prior Publication Data

US 2022/0298621 A1   Sep. 22, 2022

(30) Foreign Application Priority Data

Mar. 19, 2021   (JP) ................ 2021-046244

(51) Int. Cl.
  *C23C 14/04* (2006.01)
  *G01J 5/04* (2006.01)
  *C23C 14/34* (2006.01)

(52) U.S. Cl.
  CPC ............ *C23C 14/042* (2013.01); *C23C 14/34* (2013.01); *G01J 5/048* (2013.01)

(58) Field of Classification Search
  CPC ........ C23C 14/042; C23C 14/34; G01J 5/048; G01J 5/046; G01J 5/0875; G01J 5/0879;
  (Continued)

(56) References Cited

U.S. PATENT DOCUMENTS

2007/0152804 A1* 7/2007 Breed ................. G01S 19/17
                                                        701/301
2012/0171807 A1* 7/2012 Berger ............... H01L 31/1876
                                                        118/679
(Continued)

FOREIGN PATENT DOCUMENTS

JP     2021-056313 A      4/2021
WO     2016/012579 A1     1/2016
WO     WO-2018052057 A1 * 3/2018

OTHER PUBLICATIONS

WO-2018052057-A1 Translation (Year: 2018).*

*Primary Examiner* — Jennifer Wecker
*Assistant Examiner* — Patrick S Ott
(74) *Attorney, Agent, or Firm* — POSZ LAW GROUP, PLC

(57) ABSTRACT

A method for manufacturing a near-infrared sensor cover includes arranging a mask in a region of an undercoating layer formed on a rear surface of a base, the region being different from a heater formation region in which a heater is to be formed and different from a belt-shaped separation region extending along an edge of the heater formation region, forming a heat-generating film on the mask and the undercoating layer, the heat-generating film being made of the conductive heat-generating material, peeling, using a laser, the heat-generating film formed in the separation region, and removing the mask and the heat-generating film formed on the mask. The separation region has a width that is set to be smaller than a beam diameter of each of near-infrared rays transmitted from the transmitting portion.

3 Claims, 4 Drawing Sheets

(58) Field of Classification Search
CPC . G01J 5/041; G02B 5/208; G02B 1/11; G02B 1/14; G02B 23/16; G01S 17/931; G01S 2007/4977; G01S 7/4813
See application file for complete search history.

(56) References Cited

U.S. PATENT DOCUMENTS

| | | | | |
|---|---|---|---|---|
| 2014/0374239 | A1* | 12/2014 | Yu | C23C 14/042 204/192.1 |
| 2015/0327334 | A1* | 11/2015 | Choi | H05B 3/286 219/203 |
| 2019/0293763 | A1* | 9/2019 | Okumura | G01S 17/931 |
| 2021/0096221 | A1 | 4/2021 | Okumura et al. | |

* cited by examiner

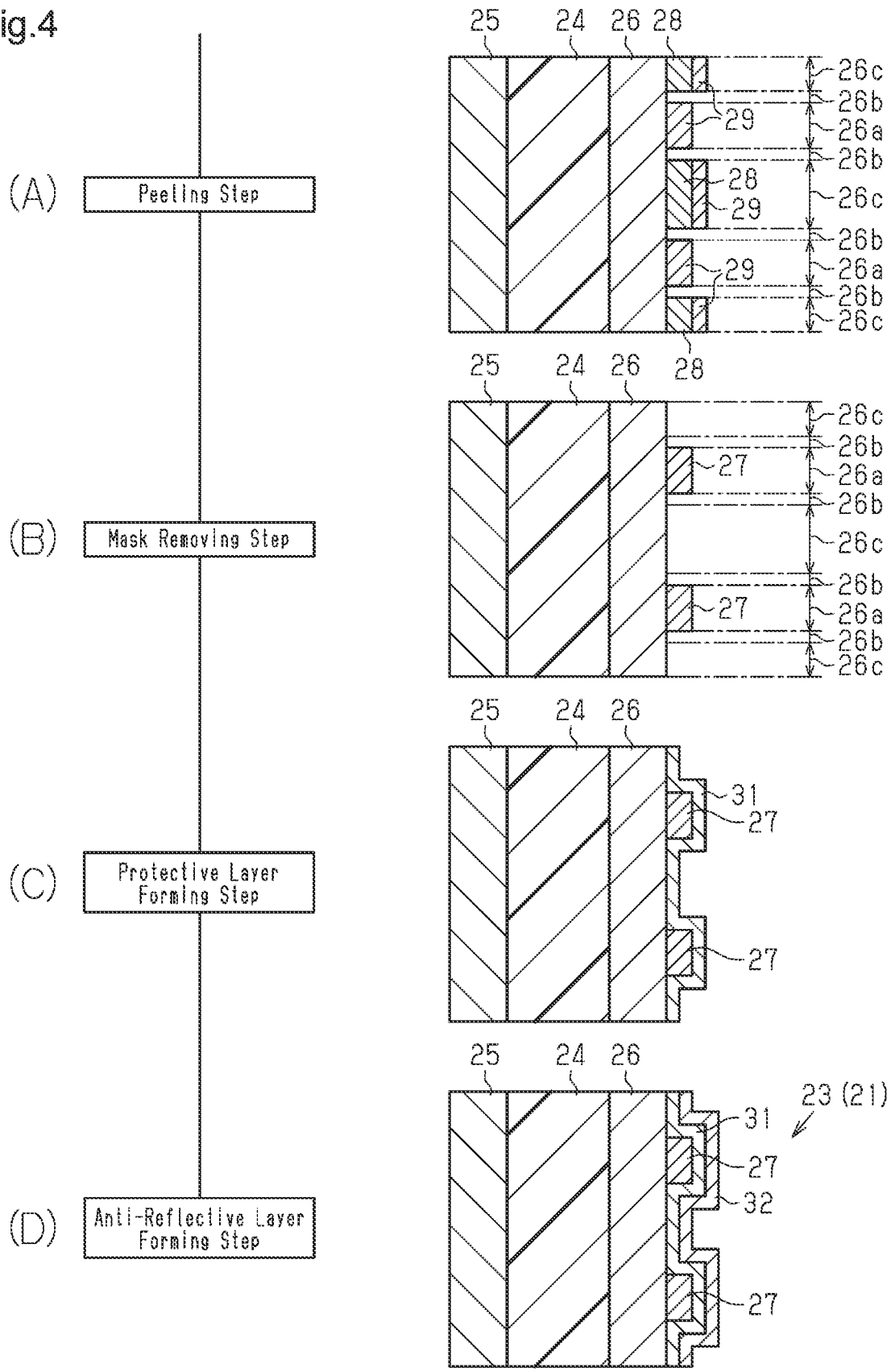

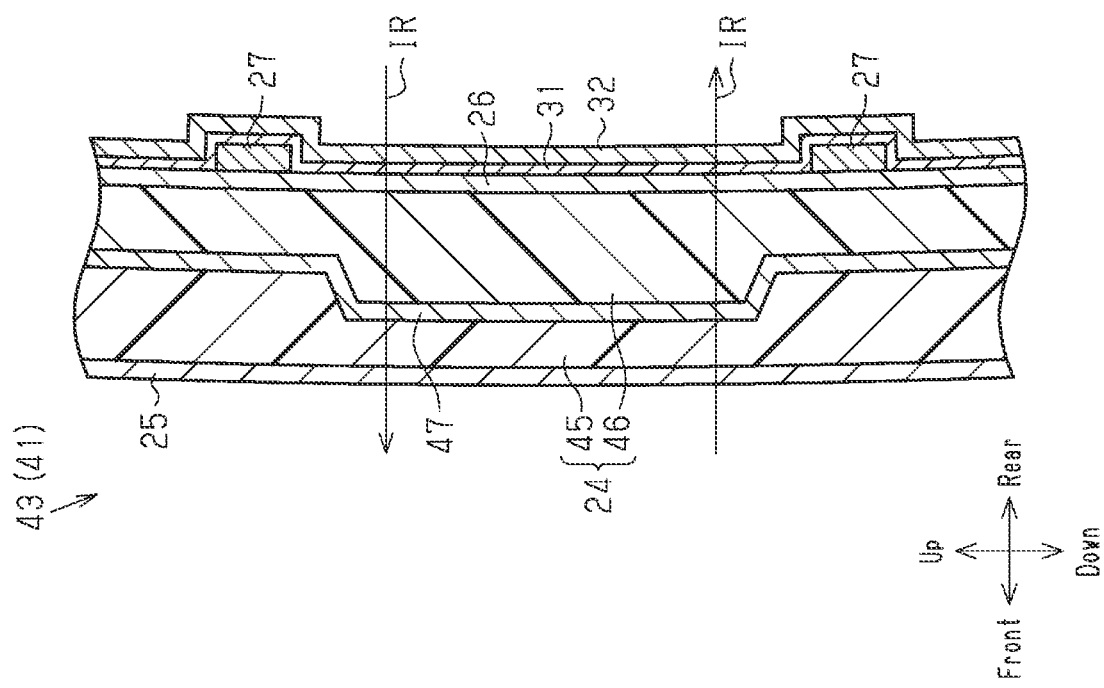
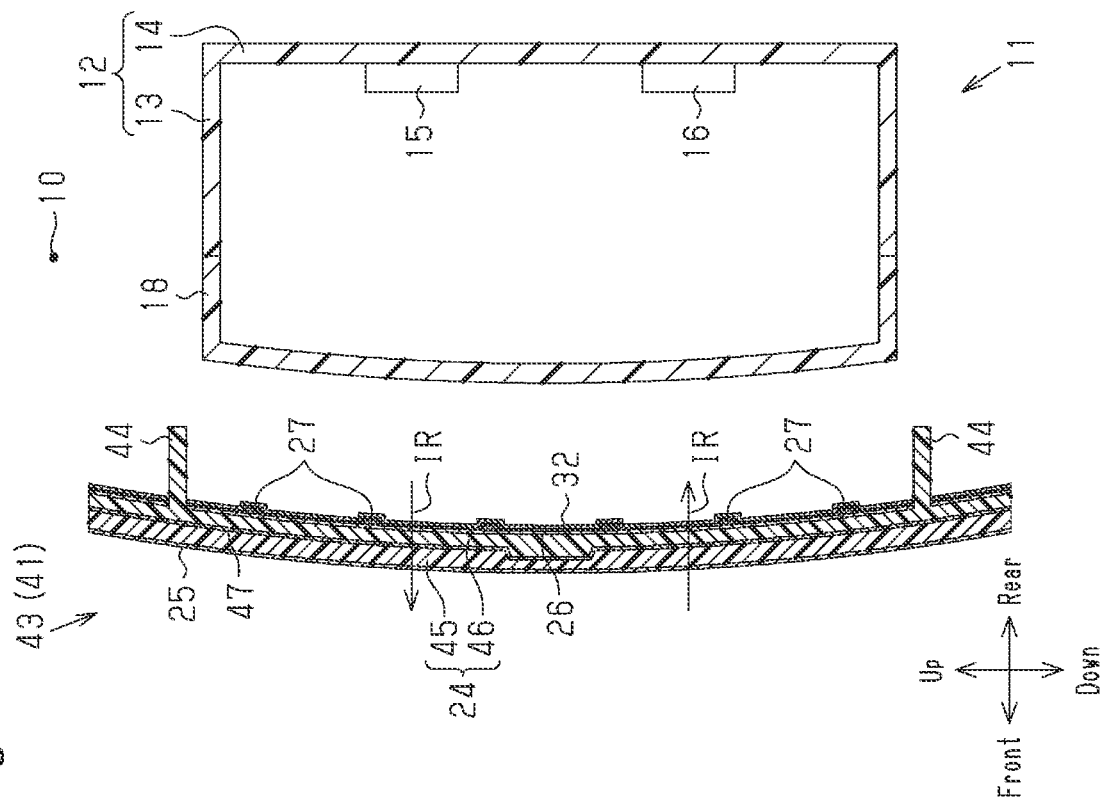

METHOD FOR MANUFACTURING NEAR-INFRARED SENSOR COVER

1. FIELD

The present disclosure relates to a method for manufacturing a near-infrared sensor cover.

2. DESCRIPTION OF RELATED ART

Near-infrared sensors disposed in a vehicle include a near-infrared ray transmitting portion and a near-infrared ray receiving portion. The transmitting portion and the receiving portion are covered by a cover body of a near-infrared sensor cover from the front in a direction in which near-infrared rays are transmitted from the transmitting portion.

In the near-infrared sensor, near-infrared rays are transmitted from the transmitting portion toward the outside the vehicle. The transmitted near-infrared rays pass through the cover body. Then, the near-infrared rays strike and are reflected by an object outside the vehicle including, for example, a leading vehicle or pedestrians. The reflected near-infrared rays pass through the cover body and are received by the receiving portion. In the near-infrared sensor, the transmitted near-infrared rays and the received near-infrared rays are used to recognize the object outside the vehicle and detect the distance between the vehicle and the object, the relative speed, and the like.

The near-infrared sensor is configured to suspend the recognition and detection when snow adheres to the near-infrared sensor. This is because the adhered snow impedes the passage of near-infrared rays. However, as use of the near-infrared sensor has become widespread, it is desired that the recognition and detection be performed even during snowfall.

Thus, various types of near-infrared sensor covers that melt snow have been proposed. For example, a known near-infrared sensor cover includes a base and a heater. The base is a part of the skeleton frame of the cover body. The heater is made of a conductive heat-generating material (e.g., copper). The heater is arranged on the rear surface of the base in the transmission direction of near-infrared rays from the transmitting portion.

Methods for arranging the heater on the rear surface of the base include sputtering, etching, and the like. For example, when etching is performed, a heat-generating film made of a conductive heat-generating material is formed on the rear surface of the base, including a heater formation region of the rear surface where the heater is to be formed. A laser is applied to a portion of the heat-generating film that is formed in a region different from the heater formation region. A portion of the heat-generating film that does not involve the formation of the heater is peeled off. The heater is defined by the portion of the heat-generating film left on the rear surface of the base after the laser peeling.

In the near-infrared sensor cover, the heater generates heat when energized. Thus, even if snow adheres to the near-infrared sensor cover, the heat generated by the heater melts the snow. This prevents the attenuation of near-infrared rays that results from the adhesion of snow.

International Publication No. 2016/012579 discloses an example of the above-described near-infrared sensor cover, in which the heater is arranged so that the near-infrared sensor cover melts snow.

Nevertheless, in the conventional near-infrared sensor cover, when a laser is applied to the heat-generating film in order to form the heater, the laser may reach not only the heat-generating film but also the rear surface of the base. In this case, the laser may potentially roughen the rear surface and cyclically form recesses and projections on the rear surface.

The following problem would occur in the near-infrared sensor cover in which cyclic recesses and projections are formed on the rear surface of the base. After near-infrared rays are transmitted from the transmitting portion, the near-infrared rays diffract when passing through the cyclic recesses and projections on the rear surface of the base. The diffraction may potentially result in interference fringes and lower the detection accuracy of the near-infrared sensor.

The problem would occur likewise in the case of forming the heat-generating film through sputtering, instead of etching.

Further, the problem would occur likewise in a near-infrared sensor cover in which an undercoating layer is arranged between the base and the heater so that the heater is in closer contact with the base. In this case, the rear surface of the undercoating layer in the transmission direction, instead of the rear surface of the base, is roughened by the laser so that cyclical recesses and projections are formed on the rear surface of the undercoating layer.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A method for manufacturing a near-infrared sensor cover that solves the above-described problem is provided. The near-infrared sensor cover includes a cover body configured to cover a near-infrared ray transmitting portion and a near-infrared ray receiving portion from a front in a transmission direction of near-infrared rays from the transmitting portion. The transmitting portion and the receiving portion are included in a near-infrared sensor. The cover body includes a base made of a plastic material and an undercoating layer formed on a rear surface of the base in the transmission direction. The undercoating layer permits passage of the near-infrared rays. The cover body includes a belt-shaped heater made of a conductive heat-generating material. The heater is formed on a rear surface of the undercoating layer in the transmission direction. The heater is in close contact with the base with the undercoating layer located between the heater and the base. The method includes arranging a mask in a region of the undercoating layer formed on the rear surface of the base. The region is different from a heater formation region in which the heater is to be formed and different from a belt-shaped separation region extending along an edge of the heater formation region. The method includes forming a heat-generating film on the mask and the undercoating layer. The heat-generating film is made of the conductive heat-generating material. The method includes peeling, using a laser, the heat-generating film formed in the separation region. The method includes removing the mask and the heat-generating film formed on the mask. The separation region has a width that is set to be smaller than a beam diameter of each of the near-infrared rays transmitted from the transmitting portion.

Other features and aspects will be apparent from the following detailed description, the drawings, and the claims.

BRIEF DESCRIPTION OF DRAWINGS

FIG. 4 is a schematic diagram illustrating subsequent steps for manufacturing the near-infrared sensor cover.

FIG. 5 is a side cross-sectional view showing a near-infrared sensor cover according to a second embodiment together with the near-infrared sensor.

FIG. 6 is an enlarged side cross-sectional view partially showing a part of the cover body in FIG. 5.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

This description provides a comprehensive understanding of the methods, apparatuses, and/or systems described. Modifications and equivalents of the methods, apparatuses, and/or systems described are apparent to one of ordinary skill in the art. Sequences of operations are exemplary, and may be changed as apparent to one of ordinary skill in the art, with the exception of operations necessarily occurring in a certain order. Descriptions of functions and constructions that are well known to one of ordinary skill in the art may be omitted.

Exemplary embodiments may have different forms, and are not limited to the examples described. However, the examples described are thorough and complete, and convey the full scope of the disclosure to one of ordinary skill in the art.

In this specification, "at least one of A and B" should be understood to mean "only A, only B, or both A and B."

First Embodiment

A method for manufacturing a near-infrared sensor cover 21 according to a first embodiment will now be described with reference to FIGS. 1 to 4.

Figure 2:
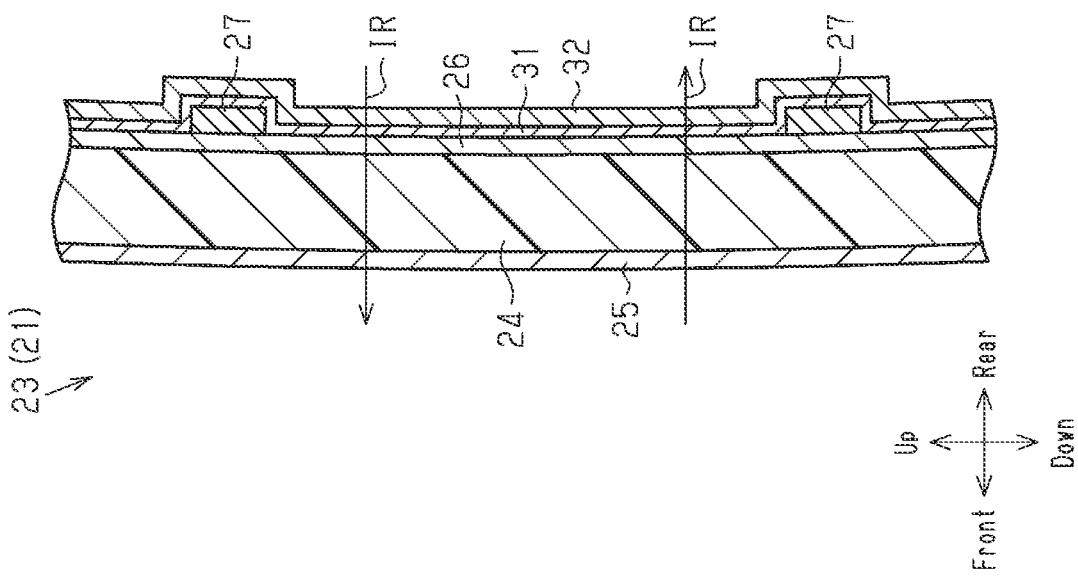
FIG. 2 is an enlarged side cross-sectional view partially showing a part of the cover body in FIG. 1.
Figure 1:
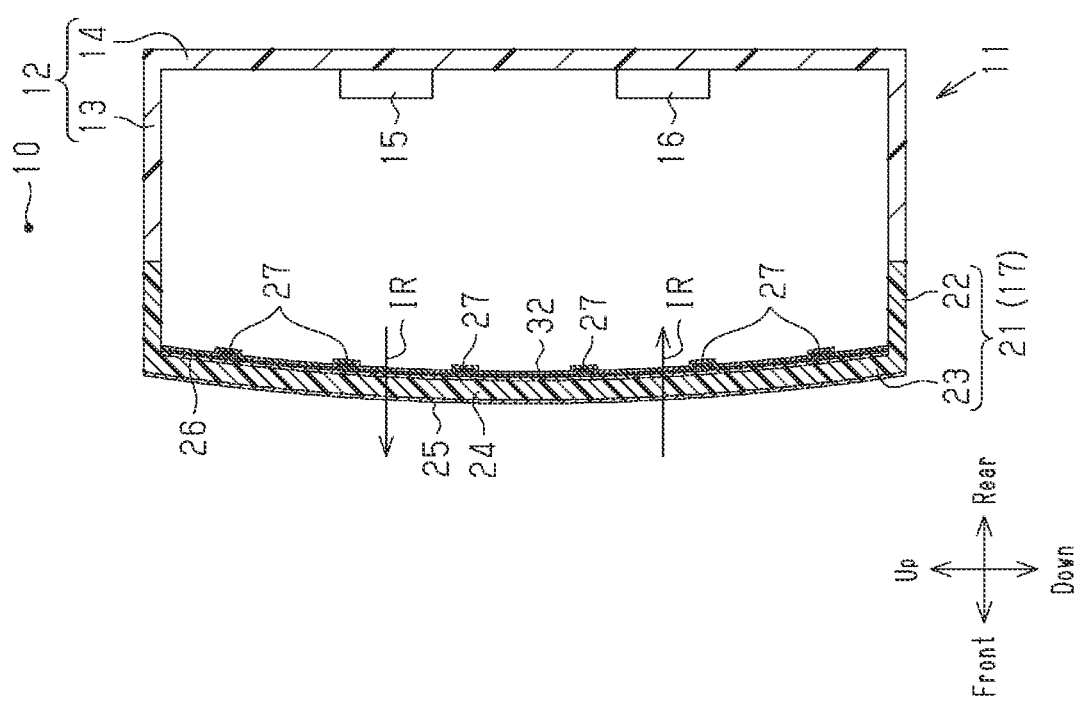
FIG. 1 is a side cross-sectional view of a near-infrared sensor in which the cover is a near-infrared sensor cover according to a first embodiment.

The direction in which a vehicle 10 travels forward is hereinafter referred to as the front. The reverse direction is hereinafter referred to as the rear. In FIGS. 1 and 2, the dimensions of components of the near-infrared sensor cover 21 are changed such that the components are recognizable. The same applies to FIGS. 5 and 6 that show a second embodiment.

First, the structure of the near-infrared sensor cover 21 will be described. As shown in FIG. 1, the front end of the vehicle 10 includes a front-monitoring near-infrared sensor 11. The near-infrared sensor 11 transmits near-infrared rays IR, each having a wavelength of 900 nm or the like, toward the front of the vehicle 10. Further, the near-infrared sensor 11 receives the near-infrared rays IR that have struck and have been reflected by an object outside the vehicle including, for example, a leading vehicle or pedestrians.

Since the near-infrared sensor 11 transmits near-infrared rays IR toward the front of the vehicle 10 as described above, the near-infrared sensor 11 transmits the near-infrared rays IR in a direction from the rear to the front of the vehicle 10. The front in the transmission direction of near-infrared rays IR substantially matches the front of the vehicle 10. The rear in the transmission direction substantially matches the rear of the vehicle 10. Thus, the front in the transmission direction of near-infrared rays IR is hereinafter simply referred to as "frontward," "front," or the like. Further, the rear in the transmission direction is hereinafter simply referred to as "rearward," "rear," or the like.

The rear half of the outer portion of the near-infrared sensor 11 is defined by a case 12. The front half of the outer portion of the near-infrared sensor 11 is defined by a cover 17. The case 12 includes a tubular peripheral wall 13 and a bottom wall 14. The bottom wall 14 is located at the rear end of the peripheral wall 13. The entire case 12 is made of a plastic material, such as polybutylene terephthalate (PBT). The case 12 includes a transmitting portion 15 and a receiving portion 16 that are located frontward from the bottom wall 14. The transmitting portion 15 transmits near-infrared rays IR. The receiving portion 16 receives near-infrared rays IR.

The cover 17 of the near-infrared sensor 11 includes the near-infrared sensor cover 21. The near-infrared sensor cover 21 includes a tubular peripheral wall 22 and a plate-shaped cover body 23. The cover body 23 is located at the front end of the peripheral wall 22.

The cover body 23 is sized so as to close the front end of the case 12. The cover body 23 covers the transmitting portion 15 and the receiving portion 16 from the front.

As shown in FIG. 2, the skeleton frame of the cover body 23 is defined by a base 24. The base 24 is made of a transparent plastic material that permits the passage of infrared rays IR. The term "transparent" in this specification includes not only a colorless and transparent state, but also a colored and transparent state. The base 24 is made of polycarbonate (PC). The base 24 may also be made of, for example, polymethyl methacrylate (PMMA) or cyclo olefin polymer (COP).

The front surface of the base 24 includes a hard coating layer 25. The hard coating layer 25 permits the passage of near-infrared rays IR and has a higher hardness than the base 24. The hard coating layer 25 is formed using a known surface finishing agent. Examples of the surface finishing agent include an organic hard coating agent (e.g., acrylate agent, oxetane agent, and silicone agent), an inorganic hard coating agent, and an organic-inorganic hybrid hard coating agent. The hard coating agent may be an agent that is hardened when irradiated with ultraviolet (UV) rays or may be an agent that is hardened when receiving heat.

The rear surface of the base 24 includes a heater 27 located between the rear surface of the base 24 and an undercoating layer 26. The undercoating layer 26 allows the heater 27 to be in closer contact with the base 24. The undercoating layer 26 is formed using an undercoating agent that is made of the same material as the hard coating layer 25.

The heater 27 has the shape of a belt and made of a conductive heat-generating material (copper in the first embodiment) and generates heat when energized. The heater 27 is wired in a predetermined wiring pattern. For example, the pattern includes linear portions extending in parallel to each other and coupling portions that couple the ends of adjacent ones of the linear portions to each other.

The heater 27 and the region of the undercoating layer 26 that does not include the heater 27 are covered by a protective layer 31 from the rear. The protective layer 31 includes a silicon dioxide ($SiO_2$) coat.

The rear surface of the protective layer 31 includes an anti-reflection layer (AR layer) 32 having a transparent thin film. The anti-reflection layer 32 is made of, for example, magnesium fluoride ($MgF_2$).

The anti-reflection layer 32 may include a single-layer thin film or may include a multilayer thin film. The multilayer thin film may include layers that differ from each other in refractive index or thickness. Such a structure reduces the reflection of near-infrared rays IR for a wide wavelength range.

Alternatively, the anti-reflection layer 32 may be formed by laminating metal oxides, such as titanium dioxide ($TiO_2$) or $SiO_2$.

The operation of the first embodiment and the method for manufacturing the near-infrared sensor cover 21 will now be described. The advantages resulting from the operation will also be described.

Figure 3:
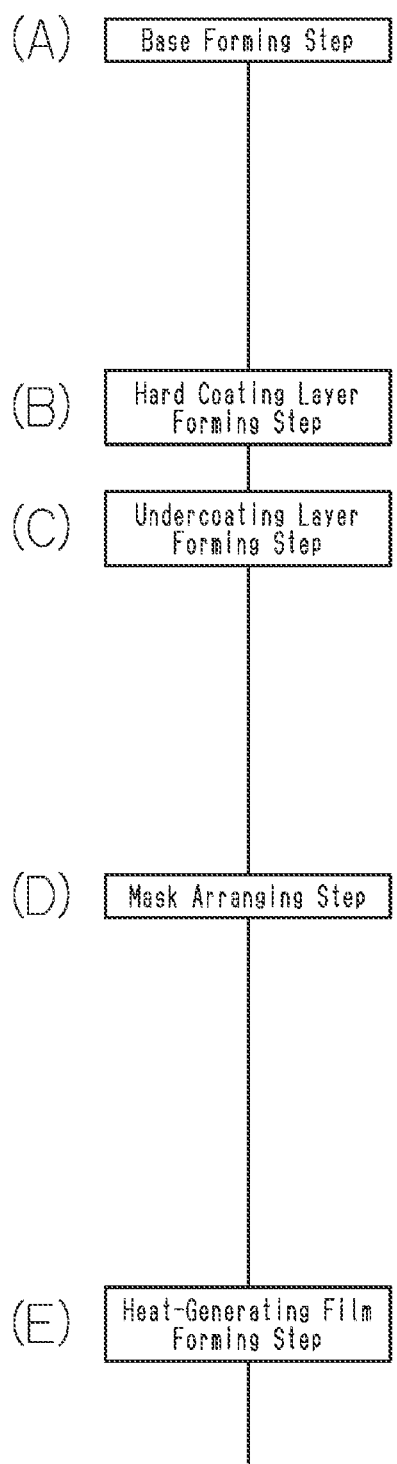
FIG. 3 is a schematic diagram illustrating steps for manufacturing the near-infrared sensor cover.
Figure 3:
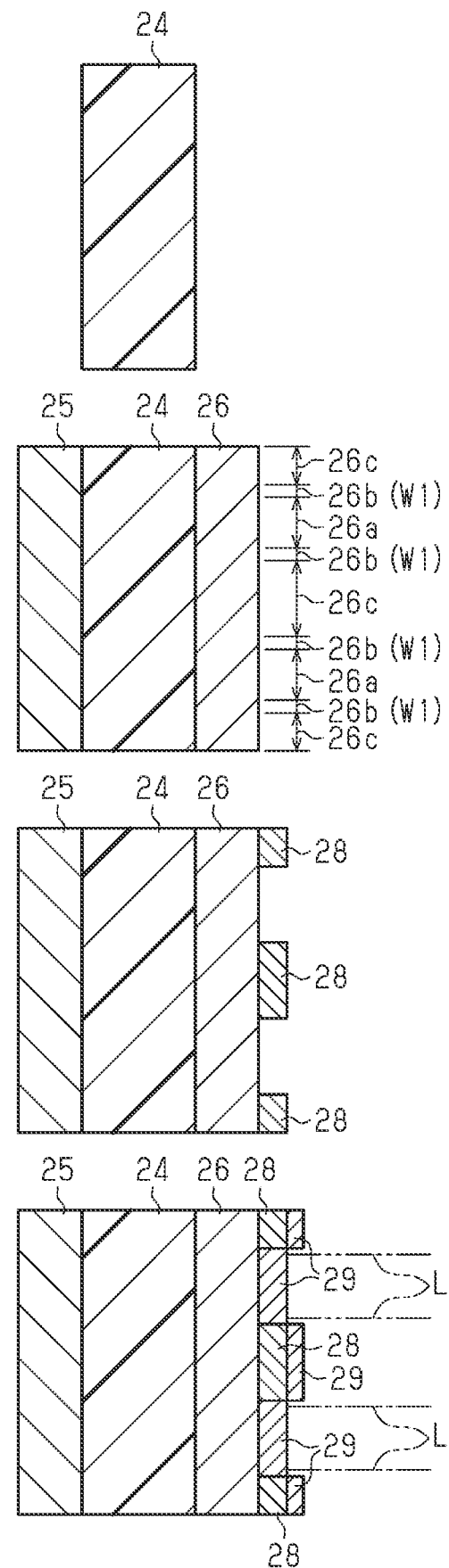

As shown in FIGS. 3 and 4, the near-infrared sensor cover 21 is formed through a base forming step, a hard coating layer forming step, an undercoating layer forming step, a mask arranging step, a heat-generating film forming step, a peeling step, a mask removing step, a protective layer forming step, and an anti-reflective layer forming step.

Base Forming Step

Referring to section (A) of FIG. 3, in the base forming step, a mold including a fixed die (not shown) and a movable die (not shown) is clamped. The clamping forms a cavity between the fixed die and the movable die. The cavity is filled with a plastic material (PC) in a molten state. After the plastic material is hardened, a transparent base 24 having a desired shape is formed in the cavity. The mold is opened so that the base 24 is pulled out of the space between the fixed die and the movable die.

Hard Coating Layer Forming Step

Referring to section (B) of FIG. 3, in the hard coating layer forming step, a surface finishing agent is applied to the front surface of the base 24. When the applied surface finishing agent is hardened, a transparent hard coating layer 25 is formed on the front surface of the base 24. The hard coating layer 25 permits the passage of near-infrared rays.

Undercoating Layer Forming Step

Referring to section (C) of FIG. 3, in the undercoating layer forming step, the above-described undercoating agent is applied to the entire rear surface of the base 24. When heat, ultraviolet rays, or the like is applied to the undercoating agent to be hardened, the undercoating layer 26 is formed.

The undercoating layer 26 includes a heater formation region 26a and a belt-shaped separation region 26b. In the heater formation region 26a, the heater 27 is to be formed. The separation region 26b extends along the edge of the heater formation region 26a. The separation region 26b has a width W1 that is set to be smaller than a beam diameter (15 mm) of each near-infrared ray IR transmitted from the transmitting portion 15 (refer to FIG. 1). In the first embodiment, the width W1 is set to 0.1 mm to 1 mm.

Mask Arranging Step

As shown in section (D) of FIG. 3, in the mask arranging step, a mask 28 is arranged in a region 26c of the undercoating layer 26 that differs from the heater formation region 26a and the separation region 26b.

Heat-Generating Film Forming Step

As shown in section (E) of FIG. 3, the heat-generating film forming step is performed for the mask 28 and for the heater formation region 26a and the separation region 26b of the undercoating layer 26. Sputtering is performed to form a copper heat-generating film 29 on the mask 28, in the heater formation region 26a, and in the separation region 26b.

Peeling Step

In the peeling step, a laser L is applied to the heat-generating film 29 formed in the separation region 26b so that the heat-generating film 29 is peeled off. As shown in section (A) of FIG. 4, the peeling separates the heat-generating film 29 formed on the mask 28 from the heat-generating film 29 formed in the heater formation region 26a.

During the peeling, when the laser L reaches the undercoating layer 26, the rear surface of the undercoating layer 26 is roughened so as to have recesses and projections. However, as described above, the width W1 of the separation region 26b is smaller than the beam diameter of each near-infrared ray IR. Thus, the separation region 26b of the undercoating layer 26 does not have cyclic recesses and projections that are sized so as to diffract the near-infrared ray IR.

Mask Removing Step

As shown in sections (A) and (B) of FIG. 4, in the mask removing step, the mask 28 and the heat-generating film 29 formed on the mask 28 are removed. The removal is performed through, for example, peeling or suction.

The mask removing step can be performed without the peeling step. However, the heat-generating film 29 formed on the mask 28 and the heat-generating film 29 formed in the heater formation region 26a are connected to each other by the heat-generating film 29 formed in the separation region 26b. Thus, when the mask 28 and the heat-generating film 29 formed on the mask 28 are removed, the heat-generating film 29 formed in the heater formation region 26a may also be removed by the heat-generating film 29 formed in the separation region 26b.

In the first embodiment, when the peeling step is performed, the heat-generating film 29 formed in the heater formation region 26a is separated from the heat-generating film 29 formed on the mask 28. This allows the mask 28 and the heat-generating film 29 formed on the mask 28 to be removed such that only the heat-generating film 29 located in the heater formation region 26a remains on the undercoating layer 26. The heater 27 is defined by the heat-generating film 29 left on the undercoating layer 26 after the mask removing step.

Protective Layer Forming Step

Referring to section (C) of FIG. 4, in the protective layer forming step, $SiO_2$ is used to sputter the heater 27 and the regions of the undercoating layer 26 in which the heater 27 is not formed (i.e., separation region 26b and region 26c). This forms the protective layer 31 ($SiO_2$ coat) that covers the heater 27 and these regions of the undercoating layer 26 from the rear.

The regions of the undercoating layer 26 include the separation region 26b. When the laser L is applied to the separation region 26b of the undercoating layer 26 in the peeling step, the recesses and projections are formed in the separation region 26b. The recesses and projections are filled with the protective layer 31.

Anti-Reflective Layer Forming Step

Referring to section (D) of FIG. 4, in the anti-reflective layer forming step, a dielectric made of $MgF_2$ or the like is used to perform vapor deposition, sputtering, wet coating, or the like. This forms the anti-reflection layer 32 on the entire rear surface of the protective layer 31.

The near-infrared sensor cover 21 manufactured in the above-described manner is used as the cover 17 of the near-infrared sensor 11 as shown in FIGS. 1 and 2.

In the vehicle 10 including the near-infrared sensor 11, when near-infrared rays IR are transmitted from the transmitting portion 15, the near-infrared rays IR are applied to the rear surface of the cover body 23. The anti-reflection layer 32 limits the reflection of the applied near-infrared rays IR on the rear surface of the cover body 23.

The near-infrared rays IR that have passed through the anti-reflection layer 32 pass through the protective layer 31, the undercoating layer 26, the base 24, and the hard coating layer 25 in this order.

As described above, in the first embodiment, the rear surface of the undercoating layer 26 does not have cyclic recesses and projections that are sized so as to diffract near-infrared rays IR. This limits the diffraction of near-infrared rays 1R when passing through the separation region 26b of the undercoating layer 26. Accordingly, the generation of interference fringes caused by the diffraction is limited.

The near-infrared rays IR that have passed through the cover body 23 strike and are reflected by an object outside the vehicle including, for example, a leading vehicle or pedestrians. The reflected near-infrared rays 1R again pass through the hard coating layer 25, the base 24, the undercoating layer 26, the protective layer 31, and the anti-reflection layer 32 of the cover body 23 in this order. As described above, the near-infrared rays JR that have passed through the cover body 23 are received by the receiving portion 16. In the near-infrared sensor 11, the transmitted near-infrared rays IR are used to recognize the object outside the vehicle and detect the distance between the vehicle 10 and the object, the relative speed, and the like.

As described above, the anti-reflection layer 32 limits the reflection of near-infrared rays IR. Accordingly, a larger amount of near-infrared rays IR passes through the cover body 23. The transmissiveness of near-infrared ray IR through the cover body 23 is thus improved as compared with a structure that does not include the anti-reflection layer 32. Further, the amount of near-infrared rays IR attenuated by the cover body 23 is limited to an allowable range. As a result, the near-infrared sensor 11 easily performs the above-described recognition and detection.

The generation of interference fringes may cause the near-infrared sensor 11 to erroneously detect an object outside the vehicle. However, as described above, the first embodiment limits the diffraction of near-infrared rays IR and thus limits the generation of interference fringes caused by the diffraction. This limits a decrease in the detection accuracy of the near-infrared sensor 11 caused by interference fringes.

In one case, the base 24 is made of PC having a higher solubility parameter (SP) than the heater 27. The PC of the base 24 and the heater 27 are not compatible with each other and are in weak contact with each other.

However, in the first embodiment, the undercoating layer 26 is arranged between the base 24 and the heater 27. Thus, the undercoating layer 26 allows the heater 27 to be in closer contact with the base 24. As compared with when the heater 27 is in direct contact with the base 24, the heater 27 is in closer contact with the base 24 so that the peeling of the heater 27 from the base 24 is limited.

Further, the heater 27 is protected by the protective layer 31 that covers the heater 27 from the rear. This prevents the heater 27 from contacting and damaging another member. Thus, as compared with when the heater 27 is not protected by the protective layer 31, the durability of the heater 27 is increased. Additionally, the protective layer 31 insulates the heater 27 and stops the supply of current between the heater 27 and another member.

Furthermore, in the near-infrared sensor cover 21, the hard coating layer 25 increases the impact resistance of the cover body 23. Thus, the hard coating layer 25 limits situations in which the front surface of the cover body 23 are damaged by pebbles or the like. In addition, the hard coating layer 25 increases the weather resistance of the cover body 23. Accordingly, the hard coating layer 25 limits situations in which sunlight, wind, rain, temperature change, or the like changes properties of the cover body 23 and degrades the cover body 23.

The heater 27 generates heat when energized. Some of the heat is transferred to the front surface of the cover body 23. Thus, even if snow adheres to the front surface of the cover body 23, the snow is melted by the heat transferred from the heater 27. Even during snowfall, the near-infrared sensor 11 performs the above-described recognition and detection.

Second Embodiment

A method for manufacturing a near-infrared sensor cover 41 according to a second embodiment will now be described with reference to FIGS. 5 and 6.

In the second embodiment, as shown in FIG. 5, the near-infrared sensor cover 41 is arranged separately from the near-infrared sensor 11. More specifically, the near-infrared sensor 11 includes the case 12, to which the transmitting portion 15 and the receiving portion 16 are coupled, and includes a cover 18. The cover 18 is located frontward from the case 12 and covers the transmitting portion 15 and the receiving portion 16 from the front. The cover 18 is made of, for example, PC, PMMA, COP, or plastic glass and permits the passage of near-infrared rays IR.

The near-infrared sensor cover 41 includes a plate-shaped cover body 43 and an attachment 44 that protrudes rearward from the rear surface of the cover body 43. The cover body 43 is located frontward from the cover 18. The cover body 43 indirectly covers the transmitting portion 15 and the receiving portion 16 from the front, with the cover 18 located between the cover body 43 and the transmitting and receiving portions 15, 16.

In the same manner as the cover 17 of the near-infrared sensor 11 of the first embodiment, the near-infrared sensor cover 41 covers the transmitting portion 15 and the receiving portion 16 from the front. In addition, the near-infrared sensor cover 41 is used as a garnish that decorates the front part of the vehicle 10.

Thus, in the same manner as the cover body 23 of the first embodiment, the cover body 43 of the near-infrared sensor cover 41 of the second embodiment includes the hard coating layer 25, the base 24, the undercoating layer 26, the heater 27, the protective layer 31, and the anti-reflection layer 32 as shown in FIG. 6.

The structure of the cover body 43 is different from that of the cover body 23 in the following respects.

The base 24 is divided into a front base 45 and a rear base 46. The front base 45 is the front part of the base 24. The rear base 46 is the rear part of the base 24.

A decorative layer 47 is arranged between the front base 45 and the rear base 46.

The front base 45 and the rear base 46 are made of the same plastic material as the base 24 in the first embodiment, and permit the passage of near-infrared rays IR. The rear surface of the front base 45 is shaped so as to have a recess and a projection. The front surface of the rear base 46 is shaped so as to have a projection and a recess that respectively engage the recess and the projection of the rear surface of the front base 45.

The decorative layer 47 decorates the near-infrared sensor cover 41. The decorative layer 47 has a high transmittance of near-infrared rays IR and is made of a material having a low transmittance of visible light. The decorative layer 47 may be, for example, a colored decorative layer having a thick color (e.g., black or blue). Alternatively, the decorative layer 47 may be a brilliant decorative layer that is made of a metal material, such as indium (In), and has a metallic luster. As another option, the decorative layer 47 may be a combination of the colored decorative layer and the brilliant decorative layer. The decorative layer 47 is shaped so as to have a recess and a projection in conformance with the rear surface of the front base 45 and the front surface of the rear base 46.

Other than the above-described differences, the second embodiment is the same as the first embodiment. Thus, like or the same reference numerals are given to those components that are like or the same as the corresponding components described above in the first embodiment and detailed explanations are omitted.

The near-infrared sensor cover 41 is manufactured through the same steps as those of the near-infrared sensor cover 21. To mold the base 24 of the near-infrared sensor cover 41, one of the front base 45 and the rear base 46 (e.g., front base 45) is molded through plastic molding (e.g., injection molding). The colored decorative layer is formed on the rear surface of the front base 45 through painting or printing. Further, sputtering or vapor deposition of a metal material (e.g., indium) is performed on the rear surface of the front base 45 so that the brilliant decorative layer is formed on the rear surface of the front base 45. An intermediate molded body is obtained in which the decorative layer 47 is formed on the rear side of the front base 45 in the above-described manner. The rear base 46 is molded in contact with the rear surface of the decorative layer 47 through plastic molding (e.g., insert-molding) using the intermediate molded body as an insert.

As shown in FIG. 5, the near-infrared sensor cover 41 manufactured in the above-described manner is located frontward from the near-infrared sensor 11 and attached to the body of the vehicle 10 at the attachment 44.

In the second embodiment, when near-infrared rays IR are transmitted from the transmitting portion 15, the near-infrared rays IR pass through the anti-reflection layer 32, the protective layer 31, the undercoating layer 26, the rear base 46, the decorative layer 47, the front base 45, and the hard coating layer 25 of the cover body 43 in this order.

The near-infrared rays IR that have struck and have been reflected by an object outside the vehicle again pass through the hard coating layer 25, the front base 45, the decorative layer 47, the rear base 46, the undercoating layer 26, the protective layer 31, and the anti-reflection layer 32 of the cover body 43 in this order. The near-infrared rays IR that have passed through the cover body 43 are received by the receiving portion 16.

The second embodiment thus provides the same operation and advantages as the first embodiment. In addition, the second embodiment provides the following operation and advantages.

When visible light is applied to the cover body 43 from the front, the visible light passes through the hard coating layer 25 and the front base 45 and is reflected on the decorative layer 47. When the near-infrared sensor cover 41 is viewed from the front of the vehicle, the decorative layer 47 looks as if it is located on the rear of the front base 45 through the hard coating layer 25 and the front base 45. In this manner, the decorative layer 47 decorates the near-infrared sensor cover 41, thereby increasing the aesthetics of the near-infrared sensor cover 41 and its surroundings.

Particularly, the decorative layer 47 is shaped so as to have the recess and the projection in conformance with the shape of the rear surface of the front base 45 and the front surface of the rear base 46. Thus, the decorative layer 47 looks three-dimensional from the front of the vehicle 10. This further increases the aesthetics of the near-infrared sensor cover 41 and its surroundings.

The reflection of visible light on the decorative layer 47 occurs in front of the near-infrared sensor 11. Since the decorative layer 47 covers the near-infrared sensor 11, the near-infrared sensor 11 is difficult to see from the front of the near-infrared sensor cover 41. Thus, as compared with when the near-infrared sensor 11 is seen through the near-infrared sensor cover 41, the design of the near-infrared sensor cover 41 is improved.

The above-described embodiments may be modified as follows. The above-described present embodiment and the following modifications can be combined as long as the combined modifications remain technically consistent with each other.

Cover Bodies 23, 43

The structure of the base in the near-infrared sensor cover 21 of the first embodiment, which is the cover 17 of the near-infrared sensor 11, may be employed in the structure of the base in the near-infrared sensor cover 41 of the second embodiment, which is arranged separately from the near-infrared sensor 11. Alternatively, the structure of the base in the near-infrared sensor cover 41 of the second embodiment may be employed in the structure of the base in the near-infrared sensor cover 21 of the first embodiment.

The hard coating layer 25 may be a hard coating film having a higher hardness than the base 24. The hard coating film may be formed by applying the above-described surface finishing agent onto a film base that is made of a transparent plastic material (e.g., PC or PMMA).

At least one of the hard coating layer 25, the protective layer 31, and the anti-reflection layer 32 of each of the cover bodies 23, 43 may be omitted.

A visible light cut pigment may be mixed in the rear base 46 of the second embodiment. In the case of forming a black holding paint film on the rear surface of the decorative layer 47, the visible light cut pigment may be mixed in the black holding paint film.

The protective layer 31 does not have to include a $SiO_2$ coat. Instead, the protective layer 31 may include, for example, an acrylic or urethane paint film. In the protective layer forming step, an acrylic or urethane paint is applied to the heater 27 and the regions of the undercoating layer 26 in which the heater 27 is not formed (i.e., separation region 26b and region 26c) so that the paint is hardened.

Steps

The hard coating layer forming step may be performed subsequent to the undercoating layer forming step.

Application Target of Near-infrared Sensor Covers 21, 41

The near-infrared sensor 11 in which the transmitting portion 15 and the receiving portion 16 are covered by the near-infrared sensor cover 21 or 41 may transmit and receive near-infrared rays IR each having a wavelength of 1550 nm, instead of a wavelength of 900 nm.

In the second embodiment, the rear base 46 may be replaced with a holding paint film.

The near-infrared sensor covers 21, 41 are applicable to a structure in which the near-infrared sensor 11 is located at a part that differs from the front part of the vehicle 10, for example, at the rear part of the vehicle 10. In this case, the transmitting portion 15 transmits near-infrared rays toward the rear of the vehicle 10. The near-infrared sensor covers 21, 41 are located frontward from the transmitting portion 15 and the receiving portion 16 in the transmission direction of near-infrared rays, that is, located rearward from the transmitting portion 15 and the receiving portion 16 in the vehicle 10.

Likewise, the near-infrared sensor covers 21, 41 are applicable to a structure in which the near-infrared sensor 11 is located at a diagonally front side or a diagonally rear side of the vehicle 10.

The near-infrared sensor cover 41 of the second embodiment may be applied to a vehicle exterior part that decorates the vehicle 10 (e.g., an emblem, an ornament, or a mark).

The near-infrared sensor covers 21, 41 are applicable to a structure in which the near-infrared sensor 11 is mounted in a conveyance that differs from the vehicle 10 (e.g., a train, an airplane, or a ship).

Various changes in form and details may be made to the examples above without departing from the spirit and scope of the claims and their equivalents. The examples are for the sake of description only, and not for purposes of limitation. Descriptions of features in each example are to be considered as being applicable to similar features or aspects in other examples. Suitable results may be achieved if sequences are performed in a different order, and/or if components in a described system, architecture, device, or circuit are combined differently, and/or replaced or supplemented by other components or their equivalents. The scope of the disclosure is not defined by the detailed description, but by the claims and their equivalents. All variations within the scope of the claims and their equivalents are included in the disclosure.

The invention claimed is:

1. A method for manufacturing a near-infrared sensor cover, wherein the near-infrared sensor cover includes a cover body configured to cover a near-infrared ray transmitting portion and a near-infrared ray receiving portion, the cover body facing a transmission surface of the transmitting portion, the transmitting portion and the receiving portion being included in a near-infrared sensor, the cover body includes:

a base made of a plastic material;

an undercoating layer formed on a first surface of the base facing the transmitting portion, the undercoating layer permitting passage of the near-infrared rays; and a heater made of a conductive heat-generating material, the heater being formed on a part of a first surface of the undercoating layer facing the transmitting portion, the heater being in close contact with the base with the undercoating layer located between the heater and the base, the method comprises:

arranging a mask in a region of the undercoating layer formed on the first surface of the base, the region being different from a heater formation region in which the heater is to be formed and different from a separation region extending along an edge of the heater formation region;

forming a heat-generating film on the mask and the undercoating layer, the heat-generating film being made of the conductive heat-generating material;

peeling, using a laser, the heat-generating film formed in the separation region; and removing the mask and the heat-generating film formed on the mask, the removing of the mask and the heat-generating film formed on the mask is performed subsequent to the peeling of the heat-generating film formed in the separation region, and the separation region has a width that is set to be smaller than a beam diameter of each of the near-infrared rays transmitted from the transmitting portion.

2. The method for manufacturing the near-infrared sensor cover according to claim 1, further comprising forming a protective layer performed subsequent to the removing the mask, the protective layer covering a first surface of the heater facing the transmitting portion and the first surface of the undercoating layer so as to protect and insulate the heater.

3. The method for manufacturing the near-infrared sensor cover according to claim 2, further comprising forming an anti-reflective layer performed subsequent to the forming the protective layer, wherein the forming the anti-reflective layer includes forming the anti-reflective layer on a first surface of the protective layer facing the transmitting portion, the anti-reflective layer limiting reflection of the near-infrared rays transmitted from the transmitting portion.

\* \* \* \* \*